United States Patent
Yuan et al.

(10) Patent No.: US 11,723,179 B2
(45) Date of Patent: Aug. 8, 2023

(54) ELECTRICAL DEVICE USING COOLING DEVICE

(71) Applicant: Sungrow Power Supply Co., Ltd., Hefei (CN)

(72) Inventors: Zhi Yuan, Anhui (CN); Jie Zhou, Anhui (CN); Liwen Hu, Anhui (CN)

(73) Assignee: Sungrow Power Supply Co., Ltd., Hefei (CN)

( * ) Notice: Subject to any disclaimer, the term of this patent is extended or adjusted under 35 U.S.C. 154(b) by 0 days.

(21) Appl. No.: 17/228,580

(22) Filed: Apr. 12, 2021

(65) Prior Publication Data

US 2021/0400844 A1    Dec. 23, 2021

(30) Foreign Application Priority Data

Jun. 19, 2020  (CN) .......................... 202021151199.5

(51) Int. Cl.
*H05K 7/20*  (2006.01)
*F28D 15/02*  (2006.01)

(52) U.S. Cl.
CPC ..... *H05K 7/20936* (2013.01); *F28D 15/0266* (2013.01); *H05K 7/202* (2013.01); *H05K 7/20309* (2013.01); *H05K 7/20318* (2013.01); *F28D 15/0275* (2013.01)

(58) Field of Classification Search
CPC ........... H05K 7/20309; H05K 7/20318; H05K 7/20327; H05K 7/20881; H05K 7/20936; H01L 23/473
See application file for complete search history.

(56) References Cited

U.S. PATENT DOCUMENTS

| | | | |
|---|---|---|---|
| 9,552,025 B2* | 1/2017 | Samadiani | G06F 1/20 |
| 9,742,305 B2* | 8/2017 | Takabayashi | H02M 7/003 |
| 9,763,358 B2* | 9/2017 | Habert | F25B 33/00 |
| 10,064,316 B2* | 8/2018 | Ono | H05K 7/20909 |
| 10,791,650 B2* | 9/2020 | Tsukui | H05K 7/20936 |
| 2003/0057546 A1 | 3/2003 | Memory et al. | |
| 2021/0105912 A1* | 4/2021 | Takabayashi | H05K 7/20 |

FOREIGN PATENT DOCUMENTS

| | | |
|---|---|---|
| EP | 1 298 975 A2 | 4/2003 |
| WO | WO 2010/027311 A1 | 3/2010 |

OTHER PUBLICATIONS

Extended European Search Report for European Application No. 21168210.9, dated Oct. 12, 2021.

* cited by examiner

*Primary Examiner* — Zachary Pape
(74) *Attorney, Agent, or Firm* — Wolf, Greenfield & Sacks, P.C.

(57) ABSTRACT

The present disclosure provides an electrical device using a cooling device, which includes a first box, a second box arranged on one side of the first box, and a power device arranged inside the first box. The cooling device is arranged inside the second box, and the cooling device includes a substrate evaporator, a first condenser and a pipe. The cooling device is configured to collect the heat inside the first box to the second box, that is, the substrate evaporator directly absorbs the heat generated by the high-power devices inside the first box. Moreover, the spoiler fan arranged inside the first box can disturb the air inside the first box, so that the spoiler fan and the first box evaporator cooperate to exchange heat in the air inside the first box.

6 Claims, 2 Drawing Sheets

ELECTRICAL DEVICE USING COOLING DEVICE

The present disclosure claims the priority to Chinese patent application No. 202021151199.5 titled "ELECTRICAL DEVICE USING COOLING DEVICE", filed with the China National Intellectual Property Administration on Jun. 19, 2020, which is incorporated herein by reference in its entirety.

TECHNICAL FIELD

The present disclosure relates to the technical field of electrical devices, and in particular to an electrical device using a cooling device.

BACKGROUND

With the development of technology, an electrical device continues to be upgraded and improved. The number of internal power devices thereof is increasing and the power of the power devices is also increasing, which thus makes the electrical device have high requirements for cooling.

In the conventional technology, for example, a string inverter uses two cooling boxes combined with a cooling device to dissipate heat. An open area is communicated with external environment, and a closed area is isolated from the external environment. The open area is to dissipate heat for the main device of the electrical device, and other devices in the closed area naturally dissipate heat through the surface of the box, and the main power devices in the closed area abut against the cooling device. The air duct in the open area is to inlet air from below and discharge air from above. The cooling device and the external environment are forced to perform convection heat exchange, so as to realize the cooling of the main power devices of the closed area.

The conventional technology, however, mainly has following disadvantages. Firstly, the cooling device is generally a skived-fin heat sink, which is affected by the efficiency of fins of the heat sink and has limited cooling capacity for the main power devices. Secondly, the cooling of other devices in the closed area is mainly through the natural convection heat exchange between the surface of the box and the external environment, and the efficiency of the heat exchange is low.

Therefore, the technical problem to be solved by those skilled in the art presently is how to provide an electrical device solution with an excellent cooling effect.

SUMMARY

In view of the above-mentioned problems, the present disclosure provides an electrical device using a cooling device.

The electrical device includes a first box, a second box arranged on one side of the first box, and a power device arranged inside the first box; and
 a cooling device for cooling via thermosyphon is arranged inside the second box;
 the cooling device includes a substrate evaporator, a first condenser and a pipe,
 the substrate evaporator is connected to the first condenser through the pipe.
 Preferably, the substrate evaporator includes one or more sub-evaporation areas.

Preferably, the number of the first condenser is one or more, which is connected to the one or more sub-evaporation areas through the pipe in a one-to-one correspondence.

Preferably, the cooling device further includes a first box evaporator, and
 the first box evaporator is arranged inside the first box.
 Preferably, the first box evaporator is connected to the first condenser through the pipe.
 Preferably, a second condenser is arranged inside the second box, and
 the first box evaporator is connected to the second condenser through the pipe.
 Preferably, a working fluid is filled inside the substrate evaporator and the first box evaporator.
 Preferably, the first box evaporator, the first condenser and the second condenser are all parallel flow heat exchangers or tube-fin heat exchangers.
 Preferably, the power device includes one or more high-power devices and one or more low-power devices,
 the one or more high-power devices are all arranged on one side of the cooling device; or,
 the one or more high-power devices are respectively configured with corresponding cooling devices, and the one or more high-power devices are respectively arranged on one side of the corresponding cooling devices.
 Preferably, the electrical device further includes a spoiler fan and a cooling fan, where,
 the spoiler fan is arranged inside the first box, to disturb the air inside the first box; and
 the cooling fan is arranged inside the second box, to discharge the heat collected by the cooling devices to the external environment.

The present disclosure provides the electrical device using the cooling device, and the cooling device is configured to collect the heat inside the first box to the second box, that is, the substrate evaporator directly absorbs the heat generated by the high-power devices inside the first box, and the cooling efficiency is high. Moreover, the spoiler fan arranged inside the first box can disturb the air inside the first box, so that the spoiler fan and the first box evaporator cooperate to exchange heat in the air inside the first box, thereby accelerating the rate of the air inside the first box being cooled by the first box evaporator. The heat inside the first box is collected on the first condenser and/or the second condenser in the second box, and the cooling fan discharges the collected heat, which greatly improves the cooling capacity of the electrical device.

Other features and advantages of the present disclosure will be described in the following specification, and partly become obvious from the specification, or understood by implementing the present disclosure. The purposes and other advantages of the present disclosure can be realized and obtained through the structures indicated in the specification, claims and drawings.

BRIEF DESCRIPTION OF THE DRAWINGS

For more clearly illustrating embodiments of the present disclosure or the technical solutions in the conventional technology, drawings to be used in the description of the embodiments or the conventional technology will be briefly described hereinafter. Apparently, the drawings in the following description are only some embodiments of the present disclosure. For those skilled in the art, other drawings may be obtained based on the provided drawings without any creative work.

REFERENCE NUMERALS

| 1. | first box; | 2. | second box; |
|---|---|---|---|
| 3. | spoiler fan; | 4. | cooling fan; |
| 5. | cooling device; | 6. | high-power device; |
| 51. | substrate evaporator; | 52. | first box evaporator; |
| 53. | first condenser; | 54. | pipe. |

DETAILED DESCRIPTION OF THE EMBODIMENTS

To make the purposes of the technical solutions and the advantages of the embodiments of the present disclosure more clear, the technical solutions according to the embodiments of the present disclosure will be described clearly and completely as follows in conjunction with the drawings in the embodiments of the present disclosure. It is apparent that the described embodiments are only a part of the embodiments according to the present disclosure, rather than all of the embodiments. Based on the embodiments of the present disclosure, all other obtained without creative efforts by those of the ordinary skill in the art shall fall within the protection scope of the present disclosure.

The present disclosure relates to an electrical device using a cooling device, which is configured to solve the problems that a skived-fin heat sink in conventional technology is affected by the efficiency of fins of the heat sink and has limited cooling capacity for the main power devices, and the cooling of other devices in the closed area is mainly through the natural convection heat exchange between the surface of the box and the external environment and the efficiency of the heat exchange is low.

Figure 1:
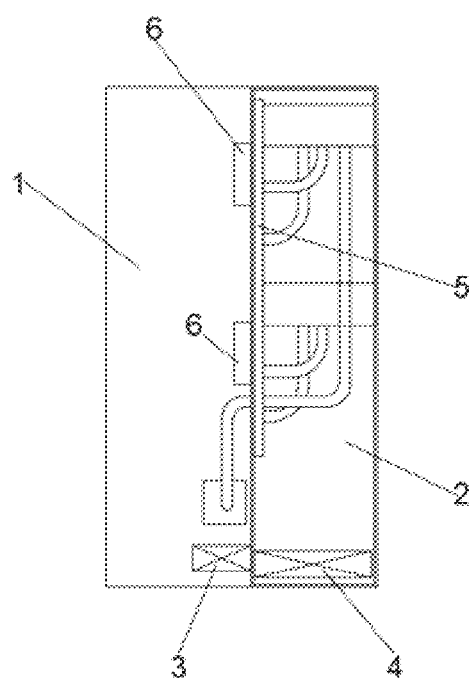
FIG. 1 is a schematic diagram showing the overall structure of electrical device according to the present disclosure.

As shown in FIG. 1, the electrical device using the cooling device with thermosyphon technology includes a first box 1, a second box 2 arranged on one side of the first box 1, and a power device arranged inside the first box 1, and a cooling device is arranged inside the second box 2. The first box 1 is a closed box, the second box 2 is an open box, and the cooling device 5 is configured to collect the heat generated by the power devices inside the first box 1, to realize fast cooling generated by the power devices, thereby improving the cooling capacity of the electrical device.

In this embodiment, the power device includes one or more high-power devices 6 and one or more low-power devices.

Figure 2:
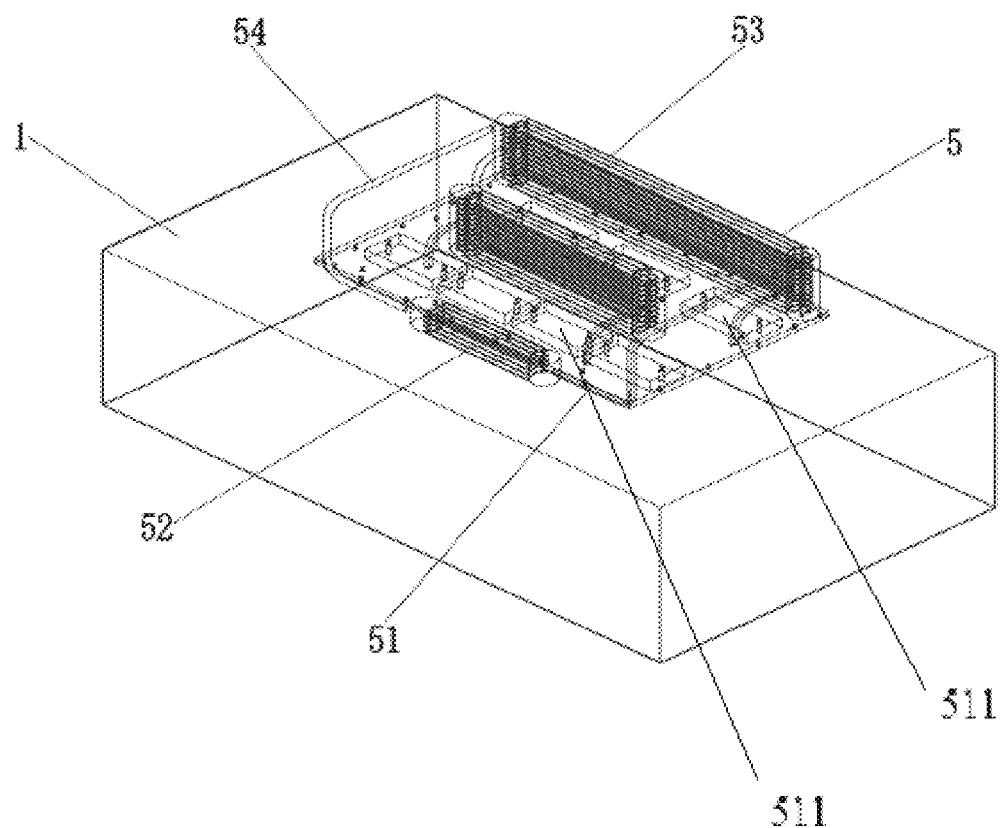
FIG. 2 is a schematic diagram showing the installation structure of the substrate evaporator according to the present disclosure.

In this embodiment, the cooling device 5 is a device that uses thermosyphon technology for cooling. Preferably, the cooling device 5 may be a thermosyphon radiator. Exemplarily, as shown in FIG. 2, the cooling device 5 includes a substrate evaporator 51, a first condenser 53 and a pipe 54. The substrate evaporator 51 is connected to the first condenser 53 through the pipe 54.

The substrate evaporator 51 is filled with working fluid. The pipe 54 is configured to connect the substrate evaporator 51 and the first condenser 53, to form a loop between the substrate evaporator 51 and the first condenser 53, and the working fluid is capable of circulating in the substrate evaporator 51, the first condenser 53 and the pipe 54.

The substrate evaporator 51 includes one or more sub-evaporation areas 511; and the number of the first condenser 53 is one or more. The first condenser 53 is configured to match the corresponding sub-evaporation area 511, and a loop is formed between the sub-evaporation area 511 and the corresponding first condenser 53, so that the working fluid is capable of circulating in the sub-evaporation area 511, the corresponding first condenser 53 and the pipe 54. The first condenser 53 is a parallel flow heat exchanger or a tube-fin heat exchanger. According to the cooling requirements, the interior of the substrate evaporator 51 may be divided into one or more independent sub-evaporation areas 511, and the corresponding first condenser 53 may be configured for each sub-evaporation area 511, so as to accelerate the efficiency of the cooling.

In this embodiment, the cooling device 5 further includes a first box evaporator 52, and the first box evaporator 52 is arranged inside the first box 1, and the first box evaporator 52 is a parallel flow heat exchanger or a tube-fin heat exchanger. Specifically, the first box evaporator 52 is filled with working fluid, and the first box evaporator 52 may be connected to the first condenser 53 through the pipe 54, and a loop is formed between the first box evaporator 52 and the first condenser 53, so that the working fluid is capable of circulating in the first box evaporator 52, the first condenser 53 and the pipe 54. Alternatively, the second condenser is arranged inside the second box 2 to dissipate heat from the first box evaporator 52 separately, where the second condenser is a parallel flow heat exchanger or a tube-fin heat exchanger. The first box evaporator 52 is connected to the second condenser through the pipe 54, and a loop is formed between the first box evaporator 52 and the second condenser, so that the working fluid is capable of circulating in the first box evaporator 52, the second condenser 53 and the pipe 54. The first box evaporator 52 effectively realizes heat exchange of the air inside the first box 1, thereby reducing the ambient temperature inside the first box.

Further, the electrical further includes a spoiler fan 3 and a cooling fan 4. The spoiler fan 3 is arranged inside the first box 1. The cooling fan 4 is arranged inside the second box 2.

The spoiler fan 3 inside the first box 1 is configured to disturb the internal air inside the first box 1. The spoiler fan 3 is configured to disturb the air circulation inside the first box 1, and the first box evaporator 52 is configured to cool the air inside the first box 1, and the spoiler fan 3 is also configured to increase the heat transfer coefficient of the first box evaporator 52, so that the first box evaporator 52 can decrease the temperature of the first box 1, and the cooling fan 4 is configured to discharge the heat collected by the cooling device 5 into air.

More specifically, one or more high-power devices 6 are all arranged on one side of the cooling device 5; or, the one or more high-power devices 6 are respectively configured with corresponding cooling devices 5, and the one or more high-power devices 6 are respectively arranged on one side of the corresponding cooling devices 5, to make the working fluid inside the substrate evaporator 51 directly absorb the heat generated by the high-power devices, which greatly improves the cooling capacity of the electrical device to the high-power device, and ensures the normal operation of the electrical device.

Exemplarily, when one substrate evaporator 51 only dissipates heat for one high-power device 6, that is, only one high-power device 6 is arranged in one substrate evaporator 51, and the working fluid filled in the cavity of the substrate evaporator 51 absorbs the heat generated by the high-power device 6, and vaporizes into a gaseous state. The gaseous working fluid is transmitted to the first condenser 53 through the pipe 54, and after the gaseous working fluid completes heat exchange with the air in the first condenser 53, the gaseous working fluid is condensed into a liquid state and flows back to the substrate evaporator 51, thus achieving one substrate evaporator 51 to dissipate heat for one high-power device 6.

Exemplarily, when one substrate evaporator 51 dissipates heat for multiple high-power devices, that is, when one substrate evaporator 51 is configured with multiple high-power devices 6, further according to the actual cooling requirements, the internal cavity of the substrate evaporator 51 is divided into multiple independent sub-evaporation areas 511. Multiple first condensers 53 are arranged inside the second box 2, and the independent sub-evaporation areas 511 are connected to the corresponding first condensers 53 through the pipe 54. So that each first condenser 53 is capable of dissipating heat for a specific area of the substrate evaporator 51, and enable the sub-evaporation areas 511 to dissipate heat of the high-power devices 6 in the corresponding areas, to improve the accuracy and efficiency of the cooling by the substrate evaporator 51 to the high-power devices 6.

Specifically, the working fluid filled in the independent sub-evaporation areas 511 of the substrate evaporator 51 absorbs the heat generated by the high-power devices 6 in the area, and vaporizes into a gaseous state. The gaseous working fluid is transmitted to the corresponding first condenser 53 through the pipe 54, and after the gaseous working fluid completes heat exchange with the air in the first condenser 53, the gaseous working fluid is condensed into a liquid state and flows back to the independent sub-evaporation areas 511 of the substrate evaporator 51, thus completing the sub-evaporation areas 511 of substrate evaporator 51 to dissipate heat for the high-power devices in the area.

Exemplarily, the first box evaporator 52 may be connected to the first condenser 53 through the pipe 54, or an independent second condenser may be provided inside the second box 2 and connected to the second box 2 through the pipe 54, to form a loop in the first box evaporator 52, the first condenser 53 or the second condenser and the pipe 54, and the working fluid circulates in the first box evaporator 52, the first condenser 53 or the second condenser and the pipe 54. Thereby, the first box evaporator 52 is capable of exchanging heat in the air inside the first box 1, and further reducing the internal temperature of the first box 1.

To sum up, the present disclosure uses cooling 5 to collect the heat inside the first box 1 to the second box 2, by arranging with the spoiler fan 3 and the first box evaporator 52 inside the first box 1, the spoiler fan 3 disturbs the air inside the first box 1, to help the first box evaporator 52 exchange heat in the air inside the first box 1. And the substrate evaporator 51, the first condenser 53 and the cooling fan 4 are arranged in the second box, so that the substrate evaporator 51 absorbs the heat generated by high-power devices inside the first box, and the cooling fan 4 is configured to dissipate heat inside the second box 2, which greatly improves the cooling capacity of the electrical device, and effectively solves the problems of limited cooling capacity and low heat exchange efficiency in conventional technology.

Although the present disclosure has been described in detail with reference to the foregoing embodiments, those having ordinary skills in the art should understand that they can still modify the technical solutions described in the foregoing embodiments, or equivalently replace some of the technical features. And these modifications or replacements do not cause the essence of the corresponding technical solutions to depart from the spirit and scope of the technical solutions of the embodiments of the present disclosure.

The invention claimed is:

1. An electrical device, comprising:
a first box,
a second box arranged on one side of the first box, and
a power device arranged inside the first box; and wherein
a cooling device for cooling via thermosyphon is arranged inside the second box;
the cooling device comprises a substrate evaporator, a first condenser and a pipe, and
the substrate evaporator is connected to the first condenser through the pipe,
wherein the power device comprises one or more power devices, wherein,
the one or more power devices are all arranged on one side of the cooling device;
wherein a first box evaporator is connected to the first condenser through the pipe.

2. The electrical device according to claim 1, wherein the substrate evaporator comprises one or more sub-evaporation areas.

3. The electrical device according to claim 1, wherein the first box evaporator is arranged inside the first box.

4. The electrical device according to claim 3, wherein working fluid is filled inside the substrate evaporator and the first box evaporator.

5. The electrical device according to claim 1, wherein the first box evaporator and the first condenser are all parallel flow heat exchangers or tube-fin heat exchangers.

6. The electrical device according to claim 1, further comprising a spoiler fan and a cooling fan, wherein,
the spoiler fan is arranged inside the first box, to disturb the air inside the first box;
the cooling fan is arranged inside the second box, to discharge the heat collected by the cooling devices from the second box.

* * * * *